(12) United States Patent
Kim

(10) Patent No.: US 7,965,576 B2
(45) Date of Patent: Jun. 21, 2011

(54) APPARATUS FOR TESTING MEMORY DEVICE

(75) Inventor: Dong-Yeol Kim, Dongjak-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 417 days.

(21) Appl. No.: 12/344,433

(22) Filed: Dec. 26, 2008

(65) Prior Publication Data

US 2009/0172311 A1    Jul. 2, 2009

(30) Foreign Application Priority Data

Dec. 27, 2007  (KR) ................. 10-2007-0138318

(51) Int. Cl.
*G11C 8/00* (2006.01)
(52) U.S. Cl. .............. 365/230.06; 365/201; 365/200
(58) Field of Classification Search .......... 365/230.06, 365/194, 200, 201
See application file for complete search history.

(56) References Cited

U.S. PATENT DOCUMENTS

| | | | | |
|---|---|---|---|---|
| 5,426,613 A * | 6/1995 | Takahashi et al. | ............ | 365/222 |
| 5,764,652 A * | 6/1998 | Chun | ............ | 714/711 |
| 5,892,727 A * | 4/1999 | Nakagawa | ............ | 365/230.06 |
| 6,085,341 A * | 7/2000 | Greason et al. | ............ | 714/718 |
| 6,882,588 B2 * | 4/2005 | Higuchi | ............ | 365/205 |
| 7,002,861 B2 * | 2/2006 | Kuo | ............ | 365/203 |
| 7,646,658 B2 * | 1/2010 | Chen et al. | ............ | 365/210.1 |
| 2008/0117702 A1 * | 5/2008 | Henry et al. | ............ | 365/206 |
| 2009/0285047 A1 * | 11/2009 | Brown et al. | ............ | 365/230.06 |

* cited by examiner

*Primary Examiner* — Richard Elms
*Assistant Examiner* — R Lance Reidlinger
(74) *Attorney, Agent, or Firm* — Sherr & Vaughn, PLLC

(57) ABSTRACT

Embodiments relate to an apparatus that may test a memory device. According to embodiments, a period of memory development may be reduced in a manner of testing a delay of a major part in a memory by adding a simple circuit without using expensive equipment and by which a memory development cost can be lowered. According to embodiments, a memory device may include a memory array and a redundancy memory. According to embodiments, a device may include a programmable redundancy decoder determining a drive force to corresponding to a selection signal, the programmable redundancy decoder outputting the determined drive force to a word line of the redundancy memory and a delay difference generating unit generating a delay difference signal corresponding to a delay difference between first and second word line signals outputted from the redundancy memory.

20 Claims, 6 Drawing Sheets

APPARATUS FOR TESTING MEMORY DEVICE

The present application claims priority under 35 U.S.C. 119 to Korean Patent Application No. 10-2007-0138318 (filed on Dec. 27, 2007), which is hereby incorporated by reference in its entirety.

BACKGROUND

In a method for measuring a drive power of a wordline decoder of a Static Random Access Memory (SRAM), each memory may be individually tested using several test chips. It may be beneficial to manufacture products with as low a cost as possible and within as short a time period as possible.

If a memory is tested by a related art method, it may be difficult to reduce a period of time taken to develop a new memory. Moreover, to measure a drive force of a driver end, a expensive equipment connectable to an internal probe may be required.

SUMMARY

Embodiments relate to a memory device, such as Static Random Access Memory (SRAM) and the like. Embodiments relate to an apparatus and method for testing a memory device.

Embodiments relate to an apparatus for testing a memory device, by which a period of memory development may be reduced by testing a delay of a major part in a memory by adding a simple circuit only without using expensive equipments. This may lower a memory development cost.

According to embodiments, an apparatus for testing a memory device may include at least one of the following. A memory array and a redundancy memory. A programmable redundancy decoder to determine a drive force corresponding to a selection signal, where the programmable redundancy decoder may output the determined drive force to a word line of the redundancy memory. A delay difference generating unit to generate a delay difference signal corresponding to a delay difference between first and second word line signals outputted from the redundancy memory.

Embodiments may provide various effects and/or advantages. For example, embodiments may measure a delay state of a word line of a memory to be tested by adding a simple circuit without using expensive equipment. In addition, embodiments may be able to test a memory device more accurately by controlling a drive force by adjusting a bit number of a selection signal to substantially match a size of a word line driver corresponding to a memory to be tested. According to embodiments, a development time of a memory device and a development cost thereof may be reduced.

DRAWINGS

Figure 1:
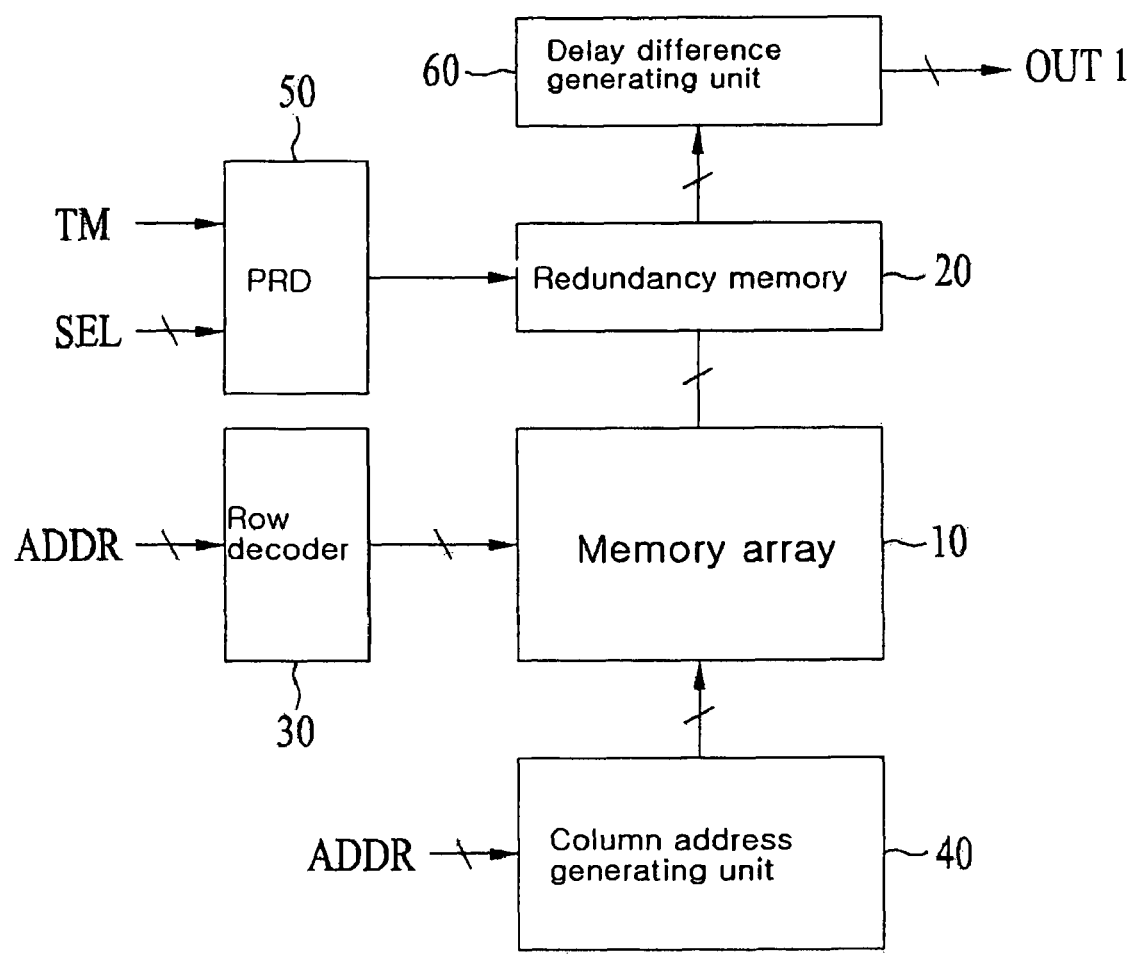

Example FIG. 1 is a block diagram of a memory device testing apparatus, according to embodiments.

Figure 2:
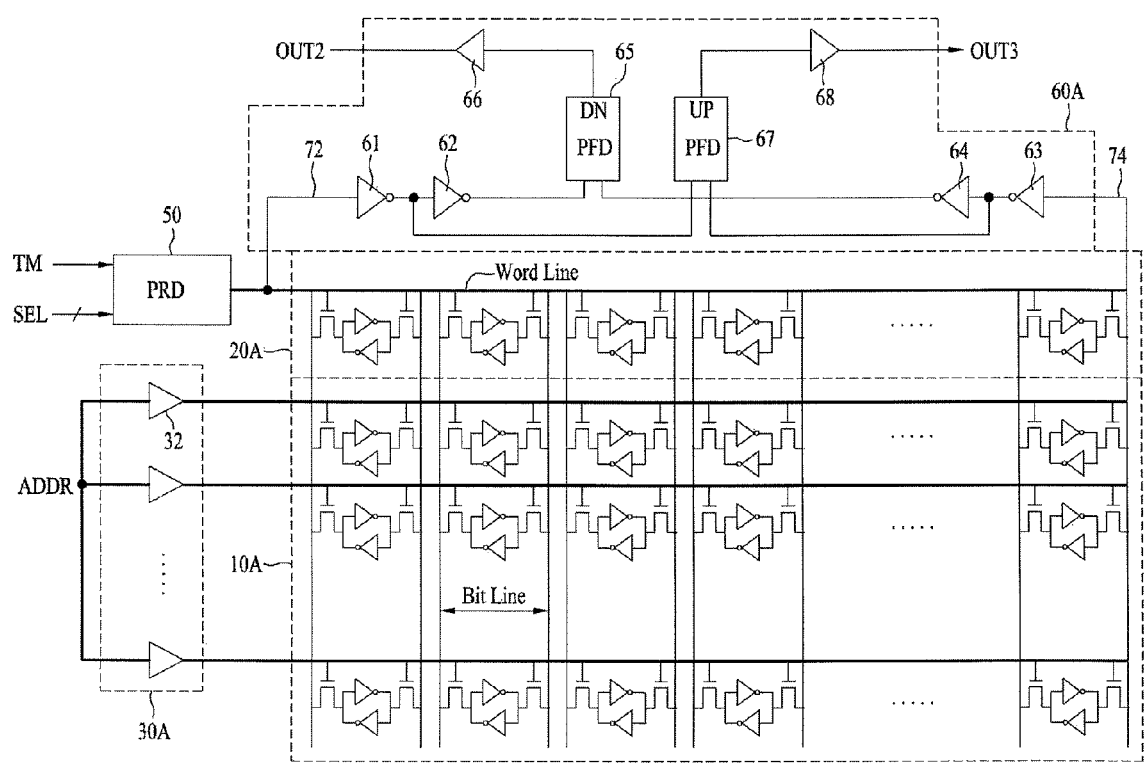

Example FIG. 2 is a schematic diagram of circuits of the respective units shown in example FIG. 1, according to embodiments.

Figure 3:
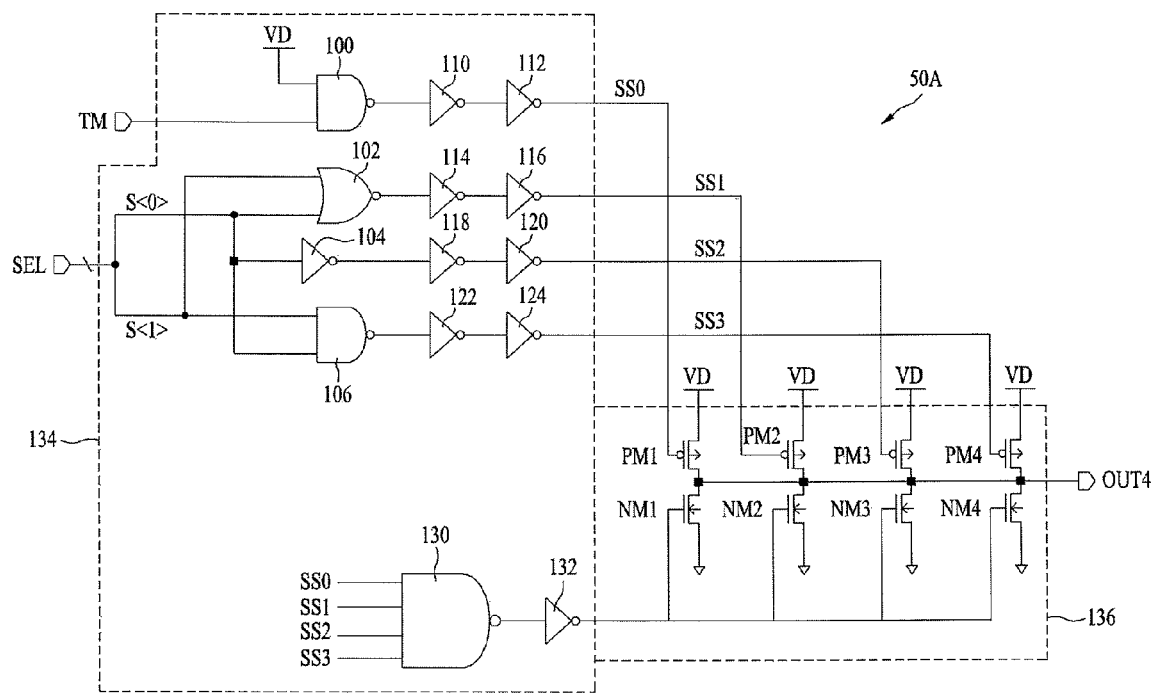

Example FIG. 3 is a circuit diagram of PRD shown in example FIG. 1 and/or example FIG. 2, according to embodiments if n=2.

Example FIGS. 4A through 4E are waveform diagrams of the respective units shown in example FIG. 3, according to embodiments.

Figure 5:
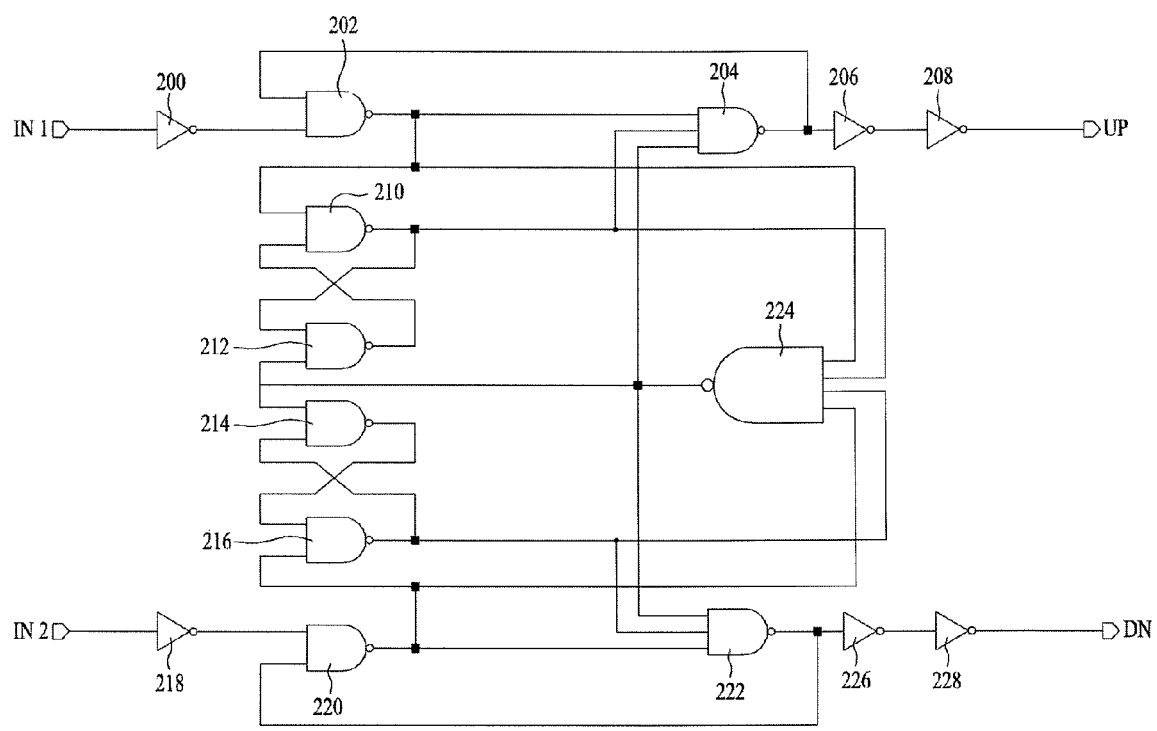

Example FIG. 5 is a diagram of circuits of first and second phase/frequency detecting units shown in example FIG. 2, according to embodiments.

Figure 6:
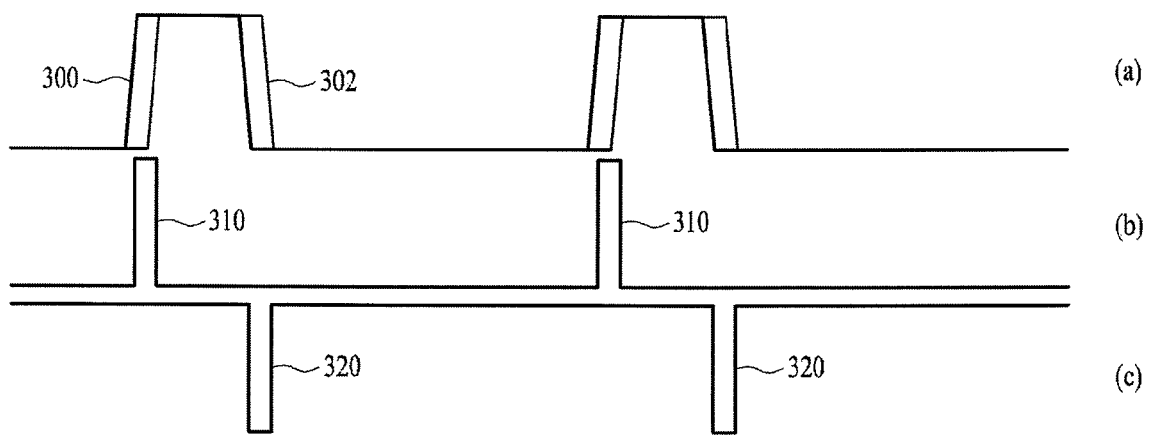

Example FIGS. 6A through 6C are wave diagrams for input/output of a delay difference generating unit shown in example FIG. 2, according to embodiments.

DESCRIPTION

Example FIG. 1 is a block diagram for a memory device testing apparatus according to embodiments. Referring to example FIG. 1, a memory device, for example a Static Random Access Memory (SRAM), may include memory array 10, redundancy memory 20, row decoder 30, column address generating unit 40, and programmable redundancy decoder (PRD) 50.

According to embodiments, row decoder 30 may receive address ADDR and may generate a row address by decoding the received address. Column address generating unit 40 may receive address ADDR and may generate a column address.

Memory array 10 may include a plurality of cells and may select a cell corresponding to a row address and a column address. Redundancy memory 20 may include cells of one row in a word line direction of memory array 10.

According to embodiments, PRD 50 of a memory device testing apparatus may determine a drive force that may correspond to selection signal SEL and may output the determined drive force to word line of redundancy memory 20. Word line of redundancy memory 20 may be enabled in response to a drive force. According to embodiments, PRD 50 may be able to perform such an operation in response to test signal TM. Test signal TM may be a signal given in a test mode. According to embodiments, test signal TM may be a 'high' logic level, received from an external environment. According to embodiments, a bit number of selection signal SEL may total n. According to embodiments, PRD 50 may be able to determine 2n drive forces different from each other.

According to embodiments, it may be possible to adjust a bit number of selection signal SEL to match a size of a word line driver for a memory device. If a bit number of selection signal SEL is incremented, it may become more flexible to select a corresponding drive force.

According to embodiments, delay difference generating unit 60 may generate a delay difference signal corresponding to a delay difference between first and second word line signals outputted from redundancy memory 20. Delay difference generating unit 60 may output a generated delay difference signal via output terminal OUT1.

First and second word line signals may be signals extracted from a word line of redundancy memory 20. According to embodiments, a first word line signal (which may be a best case signal) may be extracted from a point located closest to PRD 50. According to embodiments, a second word line signal (which may be a worst case signal) may be extracted from a point most distant from PRD 50.

According to embodiments, delay difference generating unit 60 may output "ascending delay difference," which may be a delay component of an ascending edge between the first and second word line signals. According to embodiments, delay difference generating unit 60 may output "descending delay difference," which may be a delay component of a descending edge between first and second word line signals. Delay difference generating unit 60 may output these differences via output terminal OUT1.

According to embodiments, it may be possible to obtain an amount of delay between first and second word line signals via an ascending delay difference and a descending delay difference.

Example FIG. 2 is a schematic diagram of circuits of the respective units shown in example FIG. 1, according to embodiments. Referring to example FIG. 2, row decoder 30A may include a plurality of buffers 32. According to embodiments, memory array 10A may be implemented in a pattern of a plurality of repeated cells. Redundancy memory 20A may include the same cells as cells in a word line direction of a single row in memory array 10A.

According to embodiments, an operation and configuration of PRD 50 shown in example FIG. 2 may be described as follows. Example FIG. 3 is a circuit diagram of PRD 50 shown in example FIG. 1 and/or example FIG. 2, according to embodiments. According to embodiments, "n" may have a value of 2. According to embodiments, PRD 50 may include first to 2nth inverters and logic combination unit 134.

According to embodiments, each of the inverters may be configured with upper and lower transistors, which may be opposite types, and which may be connected in series. According to embodiments, an upper transistor may be a PMOS transistor and a lower transistor may be an NMOS transistor.

According to embodiments, a value of "n" may be 2. A first inverter may include PMOS and NMOS transistors PM1 and NM1. A second inverter may include PMOS and NMOS transistors PM2 and NM2. A third inverter may include PMOS and NMOS transistors PM3 and NM3. A fourth inverter may include PMOS and NMOS transistors PM4 and NM4.

According to embodiments, first through fourth inverters may be connected in common to each other via contact points, and may connect the PMOS and NMOS transistors together. According to embodiments, first through fourth inverters may output a drive force to redundancy memory 20 via an output terminal OUT4, which may be a contact point for connecting the inverters in common to each other.

Logic combination unit 134 may perform logic combination on bits of selection signal SEL when test signal TM indicates a test mode. Logic combination unit 134 may output the logic-combined bits to first through 2nth inverters.

According to embodiments, first inverter PM1 and NM1 may operate in response to test signal TM. According to embodiments, NAND gate 100 may perform an inverse AND operation on a supply voltage VD and the test signal, and may output an inverse AND operation result to first inverter PM1 and NM1 via buffers 110 and 112.

According to embodiments, buffers 110 and 112 may buffer a signal outputted from NAND gate 100 and may output a buffered signal to first inverter PM1 and NM1. According to embodiments, if n=2, inverse OR operation unit 102 may perform an inverse OR operation on a lower bit (S<0>) and an upper bit (S<1>) of selection signal SEL and may output an OR operation result to second inverter PM2 and NM2 via buffers 114 and 116.

According to embodiments, first inverting unit 104 may invert a lower bit (S<0>) and may output an inverted bit to third inverter PM3 and NM3 via the buffers 118 and 120. According to embodiments, first inverse AND operation unit 106 may perform an inverse AND operation on a lower bit (S<0>) and an upper bit (S<1>) and may output an inverse AND operation result to fourth inverter PM4 and NM4 via buffers 122 and 124.

According to embodiments, AND operation units 130 and 132 may perform an AND operation on a result SS0 of test signal TM that may be outputted via NAND gate 100 and buffers 110 and 112, a result SS1 of test signal TM outputted via inverse OR operation unit 102 and buffers 114 and 116, a result SS2 of test signal TM outputted via first inverting unit 104 and buffers 118 and 120, and a result SS3 of test signal TM outputted via inverse AND operation unit 106 and buffers 122 and 124. According to embodiments, it may then output a corresponding AND operation result to each of the first through fourth inverters 136.

According to embodiments, inverse AND operation unit 130 may perform an inverse AND operation on results SS0, SS1, SS2 and SS3 and may output an inverse AND operated result to first through fourth inverters 136 via inverter 132, respectively.

According to embodiments, SS0 may be outputted to first inverter PM1 and NM1. SS1 may be outputted to second inverter PM2 and NM2. SS2 may be outputted to third inverter PM3 and NM3. SS3 may be outputted to fourth inverter PM4 and NM4.

Figure 4:
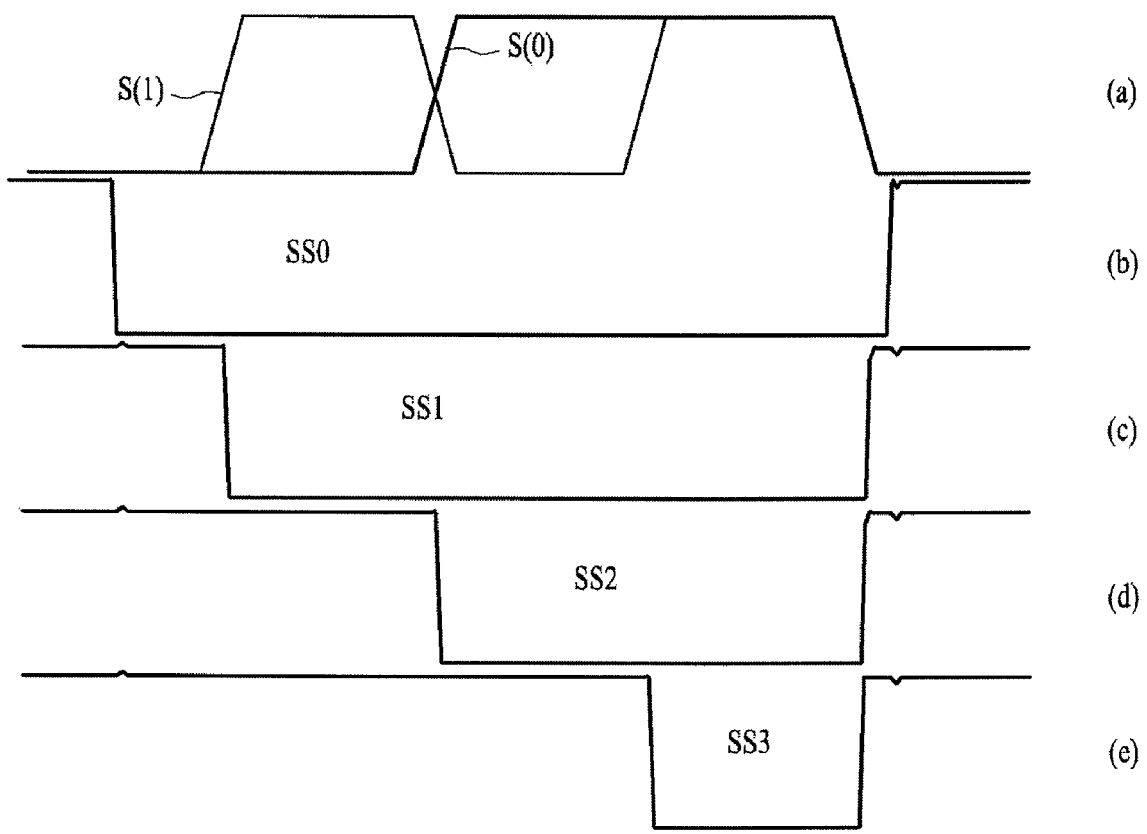

Example FIGS. 4A through 4E are waveform diagrams of the respective units shown in example FIG. 3. Example FIG. 4A shows a waveform diagram of upper and lower bits S<1> and S<0> of a selection signal SEL, according to embodiments. Example FIGS. 4B through 4E show waveforms of SS0, SS1, SS2 and SS3, respectively, according to embodiments.

Referring to example FIG. 3 and example FIGS. 4A through 4E, states of test signal TM, upper bit S<1>, lower bit S<0> and results SS0 through SS3 inputted to inverters 136 may be represented as Table 1.

TABLE 1

| TM | S<0> | S<1> | state |
|---|---|---|---|
| 1 | 0 | 0 | SS0 |
| 1 | 0 | 1 | SS0 SS1 |
| 1 | 1 | 0 | SS0 SS1 SS2 |
| 1 | 1 | 1 | SS0 SS1 SS2 SS3 |

Referring to Table 1, according to embodiments, if S<0> and S<1> are '00', SS0 may become '1' only. According to embodiments, '1' may indicate a 'high' logic level. If S<0> and S<1> are '01', both S80 and SS1 may become '1'. If S<0> and S<1> are '10', S80, SS1 and SS2 may become '1'. If S<0> and S<1> are '11', SS0, SS1, SS2 and SS3 may become '1'. If each of SS0, SS1, SS2 and SS3 becomes '1', a drive force may become maximized.

In the following description, configurations and operations of delay difference generating unit 60 and 60A may be described, according to embodiments.

According to embodiments, delay difference generating unit 60A, as shown in example FIG. 2, may include first and second phase frequency detectors (PFDs) 65 and 67 and logic devices 61, 62, 63, 64, 66 and 68. According to embodiments, first PFD 65 may measure phase and frequency ascending delay differences between first and second word line signals 72 and 74 and may output a measured ascending delay difference as a delay difference signal to output terminal OUT2 via buffer 66.

According to embodiments, first word line signal 72 may be provided to first PFD 65 via buffers 61 and 62 and second word line signal 74 may be provided to first PFD 65 via buffers 63 and 64. Second PFD 67 may measure a phase and frequency descending delay difference between a first word line signal inverted by inverter 61 and a second word line signal inverted by inverter 63 and may output a measured descending delay difference as a delay difference signal to output terminal OUT3 via buffer 68.

Example FIG. 5 is a diagram of circuits of first and second phase/frequency detectors 65 and 67 shown in example FIG. 2, according to embodiments. According to embodiments, first through tenth inverse AND operation units 202, 210, 212, 214, 216, 220, 204, 222 and 224 and logic devices 200, 206, 208, 218, 226 and 228 may be included.

According to embodiments, a circuit shown in example FIG. 5 may correspond to first PFD 65. In such a configuration, corresponding operations may be described as follows. According to embodiments, second inverse AND operation unit 202 may perform an inverse AND operation on a first word line signal, which may be inputted to input terminal IN1 and may be inverted by the inverter 200. A first result may be an output of eighth inverse AND operation unit 204.

According to embodiments, third inverse AND operation unit 210 may perform an inverse AND operation on an output of second inverse AND operation unit 202 and a second result from an output of fourth inverse AND operation unit 212. According to embodiments, fourth inverse AND operation unit 212 may perform an inverse AND operation on an output of third inverse AND operation unit 210 and a third result from an output of tenth inverse AND operation unit 224, and may output an inverse AND operated result as a second result.

According to embodiments, fifth inverse AND operation unit 214 may perform an inverse AND operation on a third result and a fourth result that may be an output of sixth inverse AND operation unit 216. Sixth inverse AND operation unit 216 may perform an inverse AND operation on an output of fifth inverse AND operation unit 214 and a fifth result from an output of seventh inverse AND operation unit 220, and may output a result as a fourth result.

According to embodiments, seventh inverse AND operation unit 220 may perform an inverse AND operation on a second word line signal, which may be inputted via input terminal IN2 and may be inverted by inverter 218, and an ascending delay difference as an output of ninth inverse AND operation unit 222, and may output a result as a fifth result.

According to embodiments, eight inverse AND operation unit 204 may perform an inverse AND operation on outputs of second and third inverse AND operation units 202 and 210 and a third result, and may output an inverse AND operated result UP via buffers 206 and 208.

According to embodiments, ninth inverse AND operation unit 222 may perform an inverse AND operation on third through fifth results, and may output an inverse AND operated result as an ascending delay difference DN to buffer 66 (shown in example FIG. 2) via buffers 226 and 228.

According to embodiments, tenth inverse AND operation unit 224 may perform an inverse AND operation on outputs of the second and third inverse AND operation units 202 and 210 and fourth and fifth results, and may output it as a third result.

According to embodiments, if a circuit shown in example FIG. 5 corresponds to second PFD 67, corresponding operations may be described as follows.

According to embodiments, second inverse AND operation unit 202 may perform an inverse AND operation on a first word line signal, which may result from re-inverting an inverted first word line signal inputted via input terminal IN1 by inverter 200, and a descending delay difference. Third inverse AND operation unit 210 may perform an inverse AND operation on an output of second inverse AND operation unit 202 and a first result from an output of fourth inverse AND operation unit 212.

According to embodiments, fourth inverse AND operation unit 212 may perform an inverse AND operation on an output of third inverse AND operation unit 210 and a second result from an output of tenth inverse AND operation unit 224, and may output an inverse AND operated result as a first result.

According to embodiments, fifth inverse AND operation unit 214 may perform an inverse AND operation on a second result and a third result, which may be an output of sixth inverse AND operation unit 216. Sixth inverse AND operation unit 216 may perform an inverse AND operation on an output of fifth inverse AND operation unit 214 and a fourth result, and may output a result as a third result.

According to embodiments, seventh inverse AND operation unit 220 may perform an inverse AND operation on a second word line signal, which may result from re-inverting an inverted second word line signal inputted via input terminal IN2 by inverter 218, and a fifth result, and may output a result as a fourth result. Eighth inverse AND operation unit 204 may perform an inverse AND operation on outputs of second and third inverse AND operation units 202 and 210 and a second result, and may output an inverse AND operated result UP as a descending delay difference to buffer 68 (shown in example FIG. 2) via buffers 206 and 208.

According to embodiments, ninth inverse AND operation unit 222 may perform an inverse AND operation on second through fourth results, and may output inverse AND operated result DN as a fifth result. Tenth inverse AND operation unit 224 may perform an inverse AND operation on outputs of the second and third inverse AND operation units 202 and 210 and third and fourth results, and may output it as a second result.

Example FIGS. 6A through 6C are wave diagrams for input/output of a delay difference generating unit shown in example FIG. 2, according to embodiments. Example FIG. 6A shows waveforms of first word line signals 72 and 300 and second word line signals 74 and 302. Example FIG. 6B shows an ascending delay difference. Example FIG. 6C shows a descending delay difference.

According to embodiments, first and second PFDs 65 and 67 may be respectively implemented as shown in example FIG. 5. First and second word line signals 300 and 302 may be provided to delay difference generating unit 60A. Accordingly, an ascending delay difference 310 shown in example FIG. 6B may be outputted to buffer 66 via buffers 226 and 228. According to embodiments, descending delay difference 320 shown in example FIG. 6C may be outputted to buffer 68 via buffers 206 and 208.

According to embodiments, an ascending delay difference may indicate a delay difference of ascending edges of first and second word line signals 300 and 302 and a descending delay difference may indicate a delay difference of descending edges of first and second word line signals 300 and 302.

According to embodiments, a testing apparatus may measure a delay of word line using a drive force that may be selected by PRD 50. This may maximize a drive force of a word line driver that may be selected.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:
1. A device, comprising:
a memory array and a redundancy memory;
a programmable redundancy decoder configured to determine a drive force corresponding to a selection signal, the programmable redundancy decoder configured to output the determined drive force to a word line of the redundancy memory; and a delay difference generating unit configured to generate a delay difference signal corresponding to a delay difference between first and second word line signals outputted from the redundancy memory.

2. The device of claim 1, wherein the programmable redundancy decoder is configured to determine $2^n$ drive forces differing from each other, wherein n is a bit number of the selection signal.

3. The device of claim 2, wherein the programmable redundancy decoder comprises:

first through $2^{nth}$ inverters serially connected to upper and lower transistors of opposite types, the first through $2^{nth}$ inverters connected in common to each other via contact points of the upper and lower transistors to output the drive force; and a logic combination unit configured to perform a logic combination on bits of the selection signal to output to the first through $2^{nth}$ inverters, wherein the first inverter operates in response to a test signal.

4. The device of claim 3, wherein the upper transistor comprises a PMOS transistor, and wherein the lower transistor comprises an NMOS transistor.

5. The device of claim 3, wherein n=2.

6. The device of claim 5, wherein the logic combination unit comprises:

an inverse OR operation unit configured to perform an inverse OR operation on lower and upper bits of the selection signal to output to the second inverter;

a first inverting unit configured to invert the lower bit to output to the third inverter;

a first inverse AND operation unit configured to perform an inverse AND operation on the lower and upper bits to output to the fourth inverter; and an AND operation unit configured to perform an AND operation on outputs of the inverse OR operation unit, the first inverting unit and the first inverse AND operation unit, and configured to output an AND operated result to the first through fourth inverters.

7. The device of claim 1, wherein the first word line signal is outputted from a point of the word line of the redundancy memory located closest to the programmable redundancy decoder, and wherein the second word line signal is outputted from a point of the word line located farthest from the programmable redundancy decoder.

8. The device of claim 1, wherein the delay difference generating unit comprises a first phase/frequency detector configured to measure an ascending delay difference of phase and frequency between the first and second word line signals, and output the measured ascending delay difference as the delay difference signal.

9. The device of claim 8, wherein the first phase/frequency detector comprises:

a first inverse AND operation unit configured to perform an inverse AND operation on an inverted first word line signal and a first result signal;

a second inverse AND operation unit configured to perform an inverse AND operation on an output of the first inverse AND operation unit and a second result signal;

a third inverse AND operation unit configured to perform an inverse AND operation on an output of the second inverse AND operation unit and a third result signal to output the second result signal;

a fourth inverse AND operation unit configured to perform an inverse AND operation on the third and fourth result signals;

a fifth inverse AND operation unit configured to perform an inverse AND operation on an output of the fourth inverse AND operation unit and a fifth result signal to output the fourth result signal;

a sixth inverse AND operation unit configured to perform an inverse AND operation on an inverted second word line signal and the ascending delay difference to output the fifth result signal;

a seventh inverse AND operation unit configured to perform an inverse AND operation on outputs of the first and second inverse AND operation units and the third result signal to output the first result signal;

an eighth inverse AND operation unit configured to perform an inverse AND operation on the third, fourth, and fifth result signals to output the ascending delay difference; and a ninth inverse AND operation unit configured to perform an inverse AND operation on outputs of the first and second inverse AND operation units and the fourth and fifth result signals to output the third result signal.

10. The device of claim 9, wherein the logic combination unit comprises:

an inverse OR operation unit configured to perform an inverse OR operation on lower and upper bits of the selection signal to provide an output to a first inverter;

a first inverting unit configured to invert the lower bit to provide an output to a second inverter;

a tenth inverse AND operation unit configured to perform an inverse AND operation on the lower and upper bits to provide an output to a third inverter; and an AND operation unit configured to perform an AND operation on outputs of the inverse OR operation unit, a fourth inverting unit and the tenth inverse AND operation unit, the AND operation unit outputting the AND operated results to the first through fourth inverters.

11. The device of claim 10, wherein the programmable redundancy decoder is configured to determine $2^n$ drive forces differing from each other, wherein n is a bit number of the selection signal.

12. The device of claim 8, wherein the delay difference generating unit comprises a second phase/frequency detector configured to measure a descending delay difference of phase and frequency between an inverted first word line signal and an inverted second word line signal and output the measured descending delay difference as the delay difference signal.

13. The device of claim 12, wherein the second phase/frequency detector comprises:

a first inverse AND operation unit configured to perform an inverse AND operation on the first word line signal and the descending delay difference;

a second inverse AND operation unit configured to perform an inverse AND operation on an output of the first inverse AND operation unit and a first result signal;

a third inverse AND operation unit configured to perform an inverse AND operation on an output of the second inverse AND operation unit and a second result signal to output the first result signal;

a fourth inverse AND operation unit configured to perform an inverse AND operation on the second and third result signals;

a fifth inverse AND operation unit configured to perform an inverse AND operation on an output of the fourth inverse AND operation unit and a fourth result signal to output the third result signal;

a sixth inverse AND operation unit configured to perform an inverse AND operation on the second word line signal and a fifth result signal to output the fourth result signal;

a seventh inverse AND operation unit configured to perform an inverse AND operation on outputs of the first and second inverse AND operation units and the second result signal to output as the descending delay difference;

an eighth inverse AND operation unit configured to perform an inverse AND operation on the second and third result signals to output the fifth result signal; and a ninth inverse AND operation unit configured to perform an inverse AND operation on outputs of the first and second inverse operation units and the third and fourth result signals to output the second result signal.

14. The device of claim 13, wherein the logic combination unit comprises:

an inverse OR operation unit configured to perform an inverse OR operation on lower and upper bits of the selection signal to output to a first inverter;

a first inverting unit configured to invert the lower bit to output to a second inverter;

a tenth inverse AND operation unit configured to perform an inverse AND operation on the lower and upper bits to output to a third inverter; and an AND operation unit configured to perform an AND operation on outputs of the inverse OR operation unit, the tenth inverting unit and the first inverse AND operation unit, the AND operation unit outputting the AND operated results to the first through fourth inverters.

15. The device of claim 14, wherein the programmable redundancy decoder is capable of determining $2^n$ drive forces differing from each other, wherein n is a bit number of the selection signal.

16. A method, comprising:

providing a memory array and a redundancy memory;

determining a drive force corresponding to a selection signal using a programmable redundancy decoder and outputting the determined drive force from the programmable redundancy decoder to a word line of the redundancy memory; and generating a delay difference signal corresponding to a delay difference between first and second word line signals outputted from the redundancy memory using a delay difference generating unit.

17. The method of claim 16, comprising determining $2^n$ drive forces differing from each other by the programmable redundancy decoder, wherein n is a bit number of the selection signal.

18. The method of claim 17, wherein the programmable redundancy decoder comprises:

first through $2^{nth}$ inverters serially connected to upper and lower transistors of opposite types, the first through $2^{nth}$ inverters connected in common to each other via contact points of the upper and lower transistors to output the drive force; and a logic combination unit configured to perform a logic combination on bits of the selection signal to output to the first to 2nth inverters, wherein the first inverter operates in response to a test signal.

19. The method of claim 18, wherein the upper transistor comprises a PMOS transistor and wherein the lower transistor comprises an NMOS transistor.

20. The method of claim 18, wherein the programmable redundancy decoder comprises first, second, third, and fourth inverters, and wherein the logic combination unit comprises:

an inverse OR operation unit configured to perform an inverse OR operation on lower and upper bits of the selection signal to output to the second inverter;

a first inverting unit configured to invert the lower bit to output to the third inverter;

a first inverse AND operation unit configured to perform an inverse AND operation on the lower and upper bits to output to the fourth inverter; and an AND operation unit configured to perform an AND operation on outputs of the inverse OR operation unit, the first inverting unit and the first inverse AND operation unit, the AND operation unit outputting the AND operated results to the first to fourth inverters.

* * * * *